United States Patent
Chen et al.

(10) Patent No.: US 7,569,492 B1
(45) Date of Patent: Aug. 4, 2009

(54) METHOD FOR POST-ETCH CLEANS

(75) Inventors: David L. Chen, San Jose, CA (US);
Yuh-Jia Su, Cupertino, CA (US); Eddie Ka Ho Chiu, Pleasanton, CA (US);
Maria Paola Pozzoli, Santa Cruz, CA (US); Senzi Li, San Jose, CA (US);
Giuseppe Colangelo, Teramo (IT);
Simone Alba, Milan (IT); Simona Petroni, Lecce (IT)

(73) Assignees: Novellus Systems, Inc., San Jose, CA (US); STMicroelectonics S.R.L., Agrate Brianze (IT)

( * ) Notice: Subject to any disclaimer, the term of this patent is extended or adjusted under 35 U.S.C. 154(b) by 0 days.

(21) Appl. No.: 12/111,095

(22) Filed: Apr. 28, 2008

Related U.S. Application Data

(63) Continuation of application No. 10/137,096, filed on May 1, 2002, now Pat. No. 7,390,755, which is a continuation-in-part of application No. 10/108,049, filed on Mar. 26, 2002, now abandoned.

(51) Int. Cl.
*H01L 21/302* (2006.01)
(52) U.S. Cl. .................. 438/749; 438/690; 438/711; 438/713; 438/714
(58) Field of Classification Search ......... 438/689–691, 438/710–714, 725–726
See application file for complete search history.

(56) References Cited

U.S. PATENT DOCUMENTS 5,811,358 A * 9/1998 Tseng et al. ................ 438/725
2002/0090827 A1 * 7/2002 Yokoshima ................ 438/714

* cited by examiner

*Primary Examiner*—Dung A. Le
(74) *Attorney, Agent, or Firm*—Weaver Austin Villeneuve & Sampson LLP

(57) ABSTRACT

The current invention provides methods for performing a cleaning process that provides greater cleaning efficiency with less damage to device structures. After etching and photoresist stripping, a first plasma clean is performed. The first plasma clean may comprise one or more steps. Following the first plasma clean, a first HO based clean is performed. The first HO based clean may be a de-ionized water rinse, a water vapor clean, or a plasma clean, where the plasma includes hydrogen and oxygen. Following the first HO based clean, a second plasma clean is performed, which may comprise one or more steps. A second HO based clean follows the second plasma clean, and may be a de-ionized water rinse, a water vapor clean, or a plasma clean, where the plasma includes hydrogen and oxygen. For plasma processes, an RF generated plasma, a microwave generated plasma, an inductively coupled plasma, or combination may be used. Embodiments of the invention are performed after an etch, such as a metal etch, via etch, contact etch, polysilicon etch, nitride etch or shallow trench isolation etch has been performed. Photoresist may be removed either prior to, during, or after cleaning processes according to embodiments of the invention, using an oxygen-containing plasma. Photoresist removal may be performed at low temperatures.

16 Claims, 3 Drawing Sheets

METHOD FOR POST-ETCH CLEANS

CROSS-REFERENCE TO RELATED APPLICATIONS

This application is a continuation of U.S. patent application Ser. No. 10/137,096, now U.S. Pat. No. 7,390,755, filed on May 1, 2002 and which is a continuation in part of U.S. patent application Ser. No. 10/108,049 filed on Mar. 26, 2002 now abandoned. Both of these applications are incorporated herein by reference in their entireties.

FIELD OF THE INVENTION

The present invention relates to the field of semiconductor processing, and particularly to methods of post-etch cleaning.

BACKGROUND

Post etch photoresist and residue removal is a critical step in semiconductor processing. If a cleaning method is inadequate, remaining residue on one or more parts of a semiconductor device such as a semiconductor wafer can lead to problems with film quality, inadequate adhesion of subsequent layers, or diffusion contamination in subsequent processing steps. For example, during a metal etch, polymer and metal byproducts may be formed which must then be removed. Unwanted byproducts of etch processes include hydrocarbons, oxides, silicon and silicon-containing materials, and organometallic compounds.

Wet cleaning or dry plasma processes may be used to remove unwanted residue. Previously developed dry plasma cleaning processes use, for example, combinations such as $O_2$/forming gas (FG)/$CF_4$, $O_2$/$H_2O$/$CF_4$, and FG/$H_2O$/$CF_4$. (Forming gas denotes a nitrogen/hydrogen gas combination). Previously developed wet cleaning processes use, for example, amine-based solvents such as Ashland Specialty Chemical Company's ACT series or EKC Technology, Inc.'s EKC series. Alternately, strong acids such as 50:1 HF or 90% $H_2SO_4$/10% $H_2O_2$ (hot Piranha) are currently used for post etch cleans.

However, the previously developed processes have a number of drawbacks. Typically, wet clean processes use strong chemical solvents or acids, often for a significant length of time. For example, times as long as twenty minutes may be required to perform a post metal etch wet clean process with an amine-based solvent. Further, because of the aggressive cleaning chemistry and the length of time used, metal structure degradation can occur. Special handling of aggressive chemical agents may add to the cost of the post-etch cleaning process as well.

Previously developed plasma cleaning processes have drawbacks as well. For example, using a fluorine-containing plasma to perform a post metal etch clean can leave either fluorine atoms or fluorine-containing molecules on the surface or sidewall of the device structures. The fluorine may become embedded in the surface over time. Subsequent wet cleaning using, for example, deionized water, removes the embedded fluorine, leaving behind surface and sidewall pits. The amount of surface pitting is directly proportional to the fluorine content in the post metal etch clean process.

Therefore, it is desirable to provide a cleaning process that effectively removes unwanted byproducts, but does not cause significant structural damage to a semiconductor device.

SUMMARY

The current invention provides methods for performing a cleaning process that provides greater cleaning efficiency with less structural damage to a semiconductor device. In embodiments of the invention, dry plasma cleaning or wet cleaning may be used alone or in combination. Further, a passivation process may be used subsequent to processing to prevent structural damage.

Embodiments of the invention are performed after an etch, (e.g. a metal etch, via etch, contact etch, polysilicon etch, nitride etch, or shallow trench isolation etch) has been performed. Photoresist may be removed either prior to, during, or after cleaning processes according to embodiments of the invention, using an oxygen-containing plasma.

According to an embodiment of the invention, a first plasma clean is performed a photoresist strip to remove residues from the wafer. The first plasma clean may have multiple steps. Subsequently, an HO based clean is performed. A second plasma clean is performed to further remove residues, which is followed by a second HO based clean. The second plasma clean may have multiple steps. The HO based clean may be a plasma clean or a wet clean. A wet clean may be a de-ionized water rinse or water vapor rinse, either in situ or outside the process chamber. A plasma clean may be performed by exposing the residues to a plasma containing oxygen and hydrogen, such as a plasma including a material chosen from the group consisting of $H_2O$, $H_2$/$O_2$, $NH_3$/$O_2$, and $NH_3$/$H_2O$.

The first and second plasma clean can be performed, for example, using a material chosen from the group consisting of $O_2$, $N_2$, Ar, forming gas, He, $N_2O$, $CF_4$, $H_2$, and $CH_xF_y$. Additional materials may be used. The first and second plasma clean may include multiple steps. For example, the first plasma clean may include a first step using $CF_4$ and $N_2H_2$, and a second step using $CF_4$, $N_2H_2$, and $O_2$. Other materials and combinations may be used. Note that x and y may be the same. After the second plasma clean, another HO-based process such as that described above may be performed; for example, the wafer may be rinsed in de-ionized water, either in-situ or outside the processing chamber.

A more complete understanding of embodiments of the present invention will be afforded to those skilled in the art, as well as a realization of additional advantages thereof, by a consideration of the following detailed description of one or more embodiments. Reference will be made to the appended drawing that will first be described briefly.

BRIEF DESCRIPTION OF THE DRAWING

Use of the same or similar reference numbers in different figures indicates the same or like elements.

DETAILED DESCRIPTION

The current invention provides methods for performing a cleaning process that provides greater cleaning efficiency with less damage to device structures. In embodiments of the invention, dry plasma cleaning or wet cleaning methods or a combination may be used.

Figure 1A:
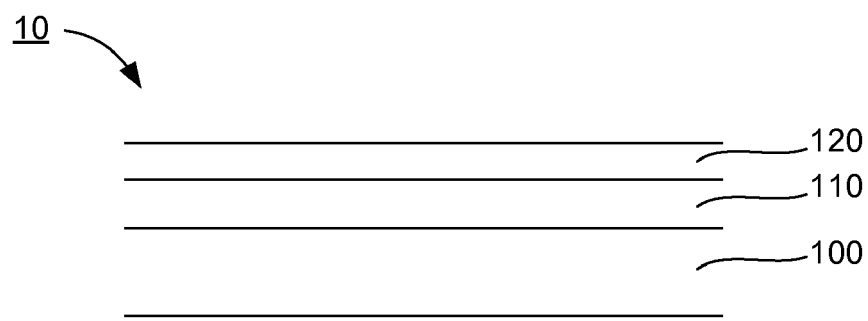
FIGS. 1A through 1E show side views of a semiconductor wafer undergoing an etch process and subsequent cleaning process according to an embodiment of the invention.
Figure 1B:
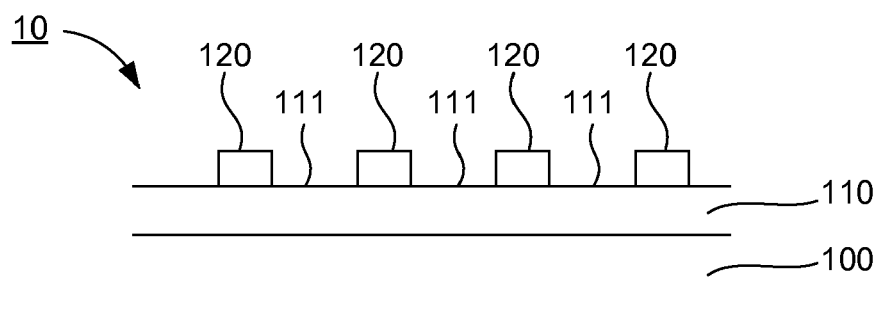
Figure 1C:
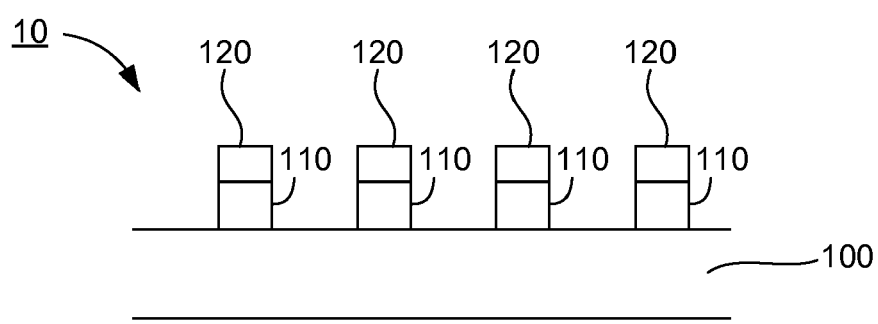

FIGS. 1A through 1E show side views of a portion of a semiconductor device (e.g. wafer) that includes at least one layer to be etched, and which may subsequently be cleaned according to one or more embodiments of the invention described below. A layer 110 of FIGS. 1A-1E, which may be a metal layer, an oxide layer, or other layer, is formed on a substrate 100 of a wafer 10. Although FIGS. 1A through 1E show layer 110 formed directly on substrate 100, there may be one or more intervening layers between substrate 100 and layer 110. A photoresist layer 120 is formed over layer 110. Photoresist layer 120 is subsequently patterned and developed, according to known methods and as shown in FIG. 1B. In FIG. 1B, after photoresist layer 120 is patterned and developed, windows 111 expose at least a portion of layer 110 for etching. An etch is performed, removing portions of layer 110 as shown in FIG. 1C.

Figure 1D:
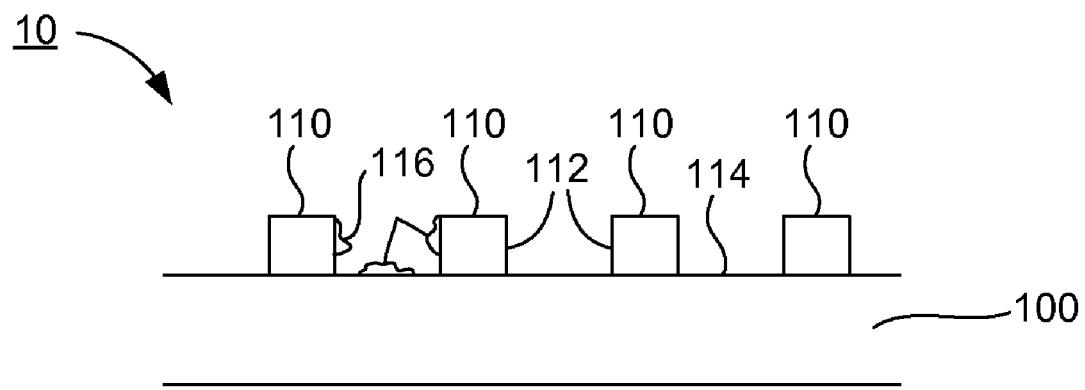
Figure 1E:
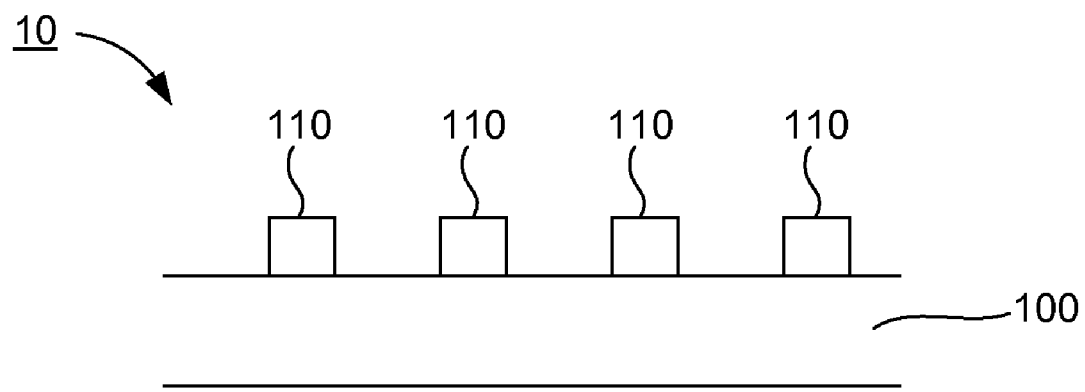

After the etch, the remaining portions of photoresist layer 120 are removed as shown in FIG. 1D, such as by using an oxygen-containing plasma. Embodiments of the invention described below use a low-temperature photoresist, which prevents excessive "baking" of residues and therefore makes post-etch cleaning easier. As a result of the etch process, polymer and/or metallic residues such as residues 116 of FIG. 1D may be produced that are difficult to remove using known methods. Cleaning according to embodiments of the invention remove residues and leave the wafer surfaces clean, as shown in FIG. 1E.

Post-etch plasma dry cleaning according to embodiments of the invention may be performed using a suitable apparatus; for example, the Novellus Iridia™ DL module, available from Novellus Systems, Inc., which provides the capability to produce both radio frequency (RF) and downstream microwave (μwave) plasmas. For embodiments in which the downstream plasma is an ICP plasma, an apparatus such as the Novellus Gamma™ system, available from Novellus Systems, Inc., may be used. Using a directional RF plasma improves cleaning on surfaces approximately perpendicular to the direction of the RF bias (e.g. top surface 114 of FIG. 1D), while using an isotropic microwave plasma improves cleaning on other surfaces, such as sidewalls 112 of FIG. 1D.

Figure 2:
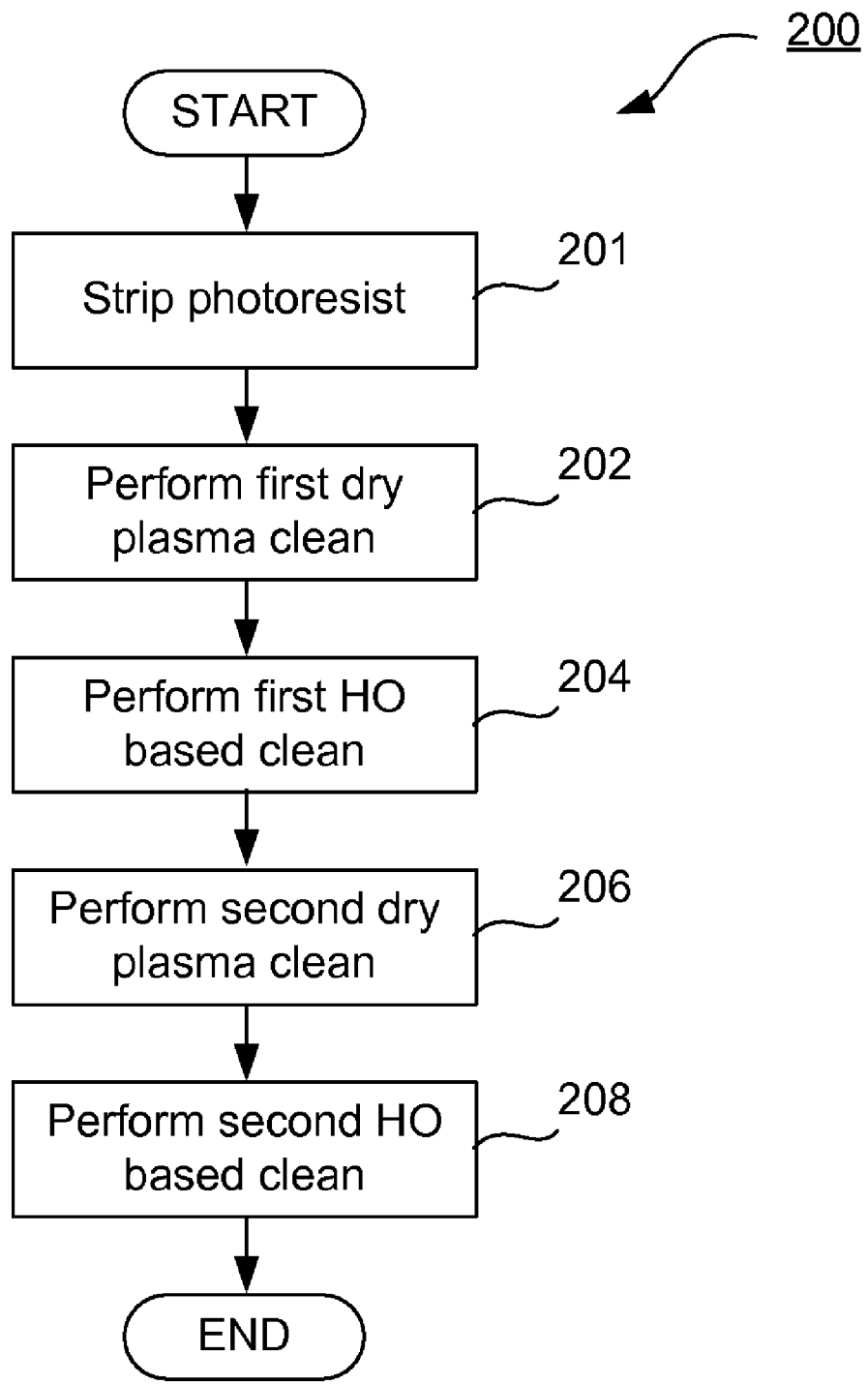
FIG. 2 is a flowchart of a method for post etch cleaning according to an embodiment of the invention.

According to an embodiment of the invention, a sequence of dry plasma cleans and HO based cleans is used after an oxygen-containing dry plasma process to remove photoresist. This cleaning method may be used for via, contact, polysilicon, shallow trench isolation, and metal cleaning applications. FIG. 2 illustrates a method 200 for post-etch cleaning, according to an embodiment of the invention. At step 201, the photoresist is stripped. After the photoresist has been stripped, at step 202, a first dry plasma clean is performed. The first dry plasma clean comprises one or more steps. At step 204, a first HO based clean is then performed. After the first HO based clean, at step 206, a second dry plasma cleaning process is used. The second dry plasma clean comprises one or more steps. Finally, at step 208, a second HO based clean, such as a de-ionized water rinse, is performed.

According to embodiments of the invention, the first and second HO based cleans can use de-ionized water, pressurized water vapor, $H_2/O_2$, $NH_3/O_2$, $H_2O_2$, or ozonized water. The HO clean is used to dissolve the soluble oxide and/or fluoride formed, for example, during the first dry plasma clean. Additionally, in embodiments where the wafer is rinsed, for example with de-ionized water, the physical action of the rinsing can help dislodge residues from the surface or can break them into smaller residues that may be removed more readily. In addition, water vapor can reduce the surface tension of organic residues. According to some embodiments of the invention, the photoresist strip and residue removal are performed in the same chamber. This provides for more efficient processing.

According to one embodiment, a low temperature (less than about 120° C., or about 20° C. to about 90° C.) oxygen-containing dry plasma clean is first performed to remove a majority of the photoresist and residue. Using a low temperature photoresist strip may provide efficient stripping while preventing residues from being baked on. Alternately, the photoresist strip may be performed using a conventional processes at a higher temperature, such as about 250° C. to about 270° C. However, using higher temperatures to remove the photoresist may make some of the other contaminants, particularly the polymer residues, more difficult to remove.

The photoresist strip is followed by a first plasma clean. The first plasma clean may use a fluorine-containing chemistry with low temperature downstream plasma (microwave or inductively coupled plasma), with or without an RF plasma. Embodiments of the invention may use $O_2$ and/or $N_2$, Ar, FG, He, $N_2O$, $CF_4$, $H_2$, and $CH_xF_y$ chemistries for the first plasma clean. The first plasma clean may have one or more steps.

After the first dry plasma cleaning, a first HO based clean is performed. The HO based clean may be a wet clean or a dry plasma clean, using a hydrogen-containing material and an oxygen-containing material. During this step, residues are re-polymerized, so that they may be more easily removed in a later step.

Subsequently, a second dry plasma clean is performed to further remove residues. This dry plasma clean removes substantially all of the remaining photoresist and polymer residue. Embodiments of the invention use $O_2$ and/or $N_2$, Ar, FG, He, $N_2O$, $CF_4$, $H_2$, and $CH_xF_y$ chemistries. The second plasma clean may have one or more steps. An HO-based clean as described above, for example, a de-ionized water rinse, may be performed after the plasma clean.

According to an embodiment of the invention, a low-temperature oxygen-containing dry plasma clean is performed at about 400 mTorr, about 420 W RF, about 400 sccm $O_2$, at about 40° C. for about 60 seconds, to strip photoresist. Alternately, other methods of stripping photoresist may be used.

Other parameters may be used for the first low-temperature oxygen-containing dry plasma, including those within the following exemplary ranges. Flows of about 10 sccm to about 1000 sccm $O_2$ may be used. RF power in the range from about 50 W to about 500 W may be used. Microwave power may be used and range from about 200 W to about 2000 W. An ICP may be used, with the ICP power ranging from about 0 to about 1000 W. The pressure may range from about 200 mTorr to about 2000 mTorr. The temperature may range from about 20° C. to about 90° C.

A first plasma dry clean is performed at about 750 mTorr, with about 1300 W microwave, about 1000 sccm $O_2$, about 50 sccm $CF_4$, at about 4° C. for about 15 seconds. Other parameters may be used for the first dry clean step, including those within the following exemplary ranges. Flows of about 10 to about 2000 sccm $O_2$ and about 10 to about 1000 sccm $CF_4$ may be used. RF power may be used, and range from about 50 W to about 500 W. The microwave power may range from about 200 W to about 2000 W. An ICP may be used, with the ICP power ranging from about 0 to about 1000 W. The pressure may range from about 200 mTorr to about 2000 mTorr. The temperature can range from about 20° C. to about 90° C.

Alternately, the first plasma dry clean may be a two-step process. The first step may be performed at about 700 mTorr, with about 250 W RF, about 20 sccm $CF_4$, and about 800 sccm $N_2H_2$, for about 40 seconds. The second step may be performed at about 700 mTorr, with about 1500 W microwave pulse, about 50 sccm $CF_4$, about 800 sccm $N_2H_2$, about 900 sccm $O_2$, for about 60 seconds.

Other parameters may be used for the first step, including those within the following exemplary ranges. Flows of about 10 to about 2000 sccm $N_2H_2$ and about 10 to about 1000 sccm $CF_4$ may be used. The RF power may range from about 50 W to about 500 W. A downstream ICP or microwave plasma may be used instead of or in addition to the RF plasma. The microwave power may range from about 200 W to about 2000 W, while the ICP power may range from about 0 to about 1000 W. The pressure may range from about 200 mTorr to about 2000 mTorr. The temperature may range from about 20° C. to about 90° C.

Other parameters may be used for the second step, including those within the following exemplary ranges. Flows of about 10 to about 2000 sccm $O_2$, about 10 to about 2000 sccm $N_2H_2$, and about 10 to about 1000 sccm $CF_4$ may be used. The microwave power may range from about 200 W to about 2000 W. An ICP may be used for the downstream plasma, with the ICP power ranging from about 0 to about 1000 W. An RF plasma may be used instead of or in addition to the downstream plasma, with the RF power ranging from about 50 W to about 500 W. The pressure may range from about 200 mTorr to about 2000 mTorr. The temperature may range from about 20° C. to about 90° C.

The second dry plasma clean can use $O_2$ and/or $N_2$, Ar, FG, He, $N_2O$, $CF_4$, $H_2$, and $CH_xF_y$ chemistries. In an embodiment, the second dry plasma clean is performed at about 700 mTorr, with about 250 W RF, about 20 sccm $CF_4$, about 800 sccm $N_2H_2$, for about 40 seconds.

Other parameters may be used for the second dry plasma clean, including those within the following exemplary ranges. Flows of about 10 to about 2000 sccm $N_2H_2$ and about 10 to about 1000 sccm $CF_4$ may be used. The RF power may range from about 50 W to about 500 W. A downstream ICP or microwave plasma may be used instead of or in addition to the RF plasma. The microwave power may range from about 200 W to about 2000 W, while the ICP power may range from about 0 to about 1000 W. The pressure may range from about 200 mTorr to about 2000 mTorr. The temperature may range from about 20° C. to about 90° C.

As stated above, the first and second H and O containing clean processes can include a de-ionized water rinse, either inside the process chamber or outside. Alternately, the HO based process used can be a dry plasma process. For example, it can be a process performed at about 750 mTorr, about 1500 W microwave power, about 500 sccm $H_2O$, at about 40° C., for about 60 seconds. Other parameters may be used for the second dry clean step, including those within the following exemplary ranges. Flows of about 10 to about 1000 sccm $H_2O$ may be used. RF power may be used, and range from about 50 W to about 500 W. The microwave power may range from about 200 W to about 2000 W. An ICP may be used, with the ICP power ranging from about 0 to about 1000 W. The pressure may range from about 200 mTorr to about 2000 mTorr. The temperature can range from about 20° C. to about 90° C.

The first and second HO based processes may be the same process or may be different. According to an embodiment, the first HO based process is an in-situ water vapor rinse, while the second HO based process is an ex-situ rinse using de-ionized water. According to another embodiment, both the first and second HO based processes are ex-situ de-ionized water rinses.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method of cleaning a semiconductor wafer, wherein said wafer has photoresist and residue remaining from an etching process, comprising:
   stripping the bulk of the photoresist from the wafer; and
   after stripping the bulk of the photoresist from the wafer, performing a process to remove at least some of the remaining residue from the wafer, said process comprising:
      removing at least a first portion of said residue by performing a first plasma clean;
      exposing said wafer to a first material comprising a first constituent comprising hydrogen and a second constituent comprising oxygen to remove at least a second portion of said residue from said wafer; and
      removing at least a third portion of said residue by performing a second plasma clean.

2. The method of claim 1, wherein said exposing said wafer to a first material comprises rinsing said wafer in de-ionized water.

3. The method of claim 1, wherein said exposing said wafer to a first material comprises exposing said wafer to water vapor.

4. The method of claim 1, wherein said exposing said wafer to a first material comprises exposing said wafer to a plasma comprising a material chosen from the group consisting of $H_2O$, $H_2/O_2$, $NH_3/O_2$, and $NH_3/H_2O$.

5. The method of claim 1 further comprising exposing said wafer to a second material comprising a third constituent comprising hydrogen and a fourth constituent comprising oxygen to remove a fourth portion of said residue from said wafer.

6. The method of claim 5, wherein said exposing said wafer to a second material comprises exposing said wafer to water vapor.

7. The method of claim 5, wherein said exposing said wafer to a second material comprises exposing said wafer to a plasma comprising a material chosen from the group consisting of $H_2O$, $H_2/O_2$, $NH_3/O_2$, and $NH_3/H_2O$.

8. The method of claim 1, wherein said performing a first plasma clean comprises exposing said wafer to a plasma comprising a material chosen from the group consisting of $O_2$, $N_2$, Ar, forming gas, He, $N_2O$, $CF_4$, $H_2$, and $CH_xF_y$.

9. The method of claim 1, wherein said performing a second plasma clean comprises exposing said wafer to a plasma comprising a material chosen from the group consisting of $O_2$, $N_2$, Ar, forming gas, He, $N_2O$, $CF_4$, H2, and $CH_xF_y$.

10. The method of claim 1, wherein performing a first plasma clean comprises performing a first plasma cleaning step and a second plasma cleaning step.

11. The method of claim 10, wherein said first plasma cleaning step comprises exposing said wafer to a plasma comprising a material chosen from the group consisting of $O_2$, $N_2$, Ar, forming gas, He, $N_2O$, $CF_4$; $H_2$, and $CH_xF_y$.

12. The method of claim 10, wherein said first plasma cleaning step comprises exposing said wafer to a plasma comprising $CF_4$ and $H_2N_2$.

13. The method of claim 10, wherein said second plasma cleaning step comprises exposing said wafer to a plasma comprising $CF_4$, $O_2$, and $H_2N_2$.

14. The method of claim 10, wherein said second plasma cleaning step comprises exposing said wafer to a plasma comprising a material chosen from the group consisting of O2, N2, Ar, forming gas, He, $N_2O$, $CF_4$, H2, and $CH_xF_y$.

15. The method of claim 1, wherein said performing a second plasma clean comprises exposing said wafer to a plasma comprising fluorine.

16. The method of claim 5, wherein said exposing said wafer to a second material comprises rinsing said wafer in de-ionized water.

* * * * *